(12) United States Patent
Itomi

(10) Patent No.: US 11,302,632 B2
(45) Date of Patent: Apr. 12, 2022

(54) SEMICONDUCTOR DEVICE AND OSCILLATOR

(71) Applicant: Seiko Epson Corporation, Tokyo (JP)

(72) Inventor: Noboru Itomi, Nirasaki (JP)

(73) Assignee: Seiko Epson Corporation

( * ) Notice: Subject to any disclaimer, the term of this patent is extended or adjusted under 35 U.S.C. 154(b) by 0 days.

(21) Appl. No.: 16/999,200

(22) Filed: Aug. 21, 2020

(65) Prior Publication Data

US 2021/0057338 A1 Feb. 25, 2021

(30) Foreign Application Priority Data

Aug. 22, 2019 (JP) .............................. JP2019-151835

(51) Int. Cl.
*H01L 23/522* (2006.01)
*H01L 23/552* (2006.01)
*H01L 23/528* (2006.01)
*H03B 5/30* (2006.01)

(52) U.S. Cl.
CPC ...... *H01L 23/5226* (2013.01); *H01L 23/5228* (2013.01); *H01L 23/5283* (2013.01); *H01L 23/552* (2013.01); *H03B 5/30* (2013.01)

(58) Field of Classification Search
CPC ... H01L 23/522; H01L 23/528; H01L 23/552; H01L 23/5226; H01L 23/5228; H01L 23/5283; H01L 23/5225; H01L 28/20; H01L 49/02; H01L 2224/73265; H01L 2224/48227; H01L 2224/32225; H01L 2924/19105; H01L 2924/16195; H01L 2924/15313; H01L 2924/00; H01L 2924/14211; H03B 5/30

USPC ......................................................... 257/659
See application file for complete search history.

(56) References Cited

U.S. PATENT DOCUMENTS

2018/0151483 A1* 5/2018 Imayoshi .......... H01L 23/49838
2019/0256351 A1* 8/2019 Dehe .................... B81C 1/00158
2020/0144260 A1* 5/2020 Do .................. H01L 21/823885

FOREIGN PATENT DOCUMENTS

JP 2003-023089 A 1/2003

* cited by examiner

*Primary Examiner* — Chuong A Luu
(74) *Attorney, Agent, or Firm* — Harness, Dickey & Pierce, P.L.C.

(57) ABSTRACT

A semiconductor device includes a first high resistance pattern and a second high resistance pattern that are disposed along an X axis and are separated from each other, a coupling pattern that couples the first high resistance pattern and the second high resistance pattern, and a signal wiring disposed at a layer above the first high resistance pattern, the second high resistance pattern, and the coupling pattern. The coupling pattern includes a first portion that overlaps an end portion of the first high resistance pattern in a plan view at the layer above the first high resistance pattern, the coupling pattern includes a second portion that overlaps an end portion of the second high resistance pattern in a plan view at a layer above the second high resistance pattern, and the signal wiring is disposed along a Y axis that intersects the X axis in a plan view between an end of the coupling pattern at the first portion side and an end of the coupling pattern at the second portion side.

7 Claims, 15 Drawing Sheets

SEMICONDUCTOR DEVICE AND OSCILLATOR

The present application is based on, and claims priority from JP Application Serial Number 2019-151835, filed Aug. 22, 2019, the disclosure of which is hereby incorporated by reference herein in its entirety.

BACKGROUND

1. Technical Field

The present disclosure relates to a semiconductor device and an oscillator.

2. Related Art

JP-A-2003-23089 discloses a semiconductor device in which, even if a polysilicon film for determining a resistance value of a resistance element is formed thin, a damage to an underlying insulation film at the time when performing etching for forming a contact hole and increase or variation in a contact resistance can be suppressed by disposing a low resistance portion and the polysilicon film in a laminated manner in the regions where the contact holes are formed on both ends of the high resistance portion, and thus, the contact resistance of the resistance element can be stabilized.

In the semiconductor device disclosed in JP-A-2003-23089, in order to reduce the size of the semiconductor device and increase the density of the wiring of the semiconductor device, in some cases, the signal wiring is disposed so as to overlap the high resistance portion in a plan view. However, an electric field is generated between the signal wiring and the high resistance portion, and then, the resistance value of the high resistance portion varies due to the current flowing in the signal wiring. Therefore, when the signal wiring is disposed so as not to overlap the high resistance portion, a dead space occurs, and there is a problem that particularly it is not suitable for reducing the size of the semiconductor device.

SUMMARY

A semiconductor device includes a first high resistance pattern and a second high resistance pattern that are disposed along a first axis and are separated from each other, a coupling pattern that electrically couples the first high resistance pattern and the second high resistance pattern, and a signal wiring disposed at a layer above the first high resistance pattern, the second high resistance pattern, and the coupling pattern. The coupling pattern includes a first portion that overlaps an end portion of the first high resistance pattern in a plan view at the layer above the first high resistance pattern, the coupling pattern includes a second portion that overlaps an end portion of the second high resistance pattern in a plan view at the upper layer from the second high resistance pattern, and the signal wiring is disposed along a second axis that intersects the first axis in a plan view between an end of the coupling pattern at the first portion side and an end of the coupling pattern at the second portion side.

An oscillator includes the semiconductor device described above and a vibrator driven by the semiconductor device.

DESCRIPTION OF EXEMPLARY EMBODIMENTS

1. First Embodiment

First, a semiconductor device 1 according to a first embodiment will be described with reference to FIGS. 1 to 5.

Figure 1:
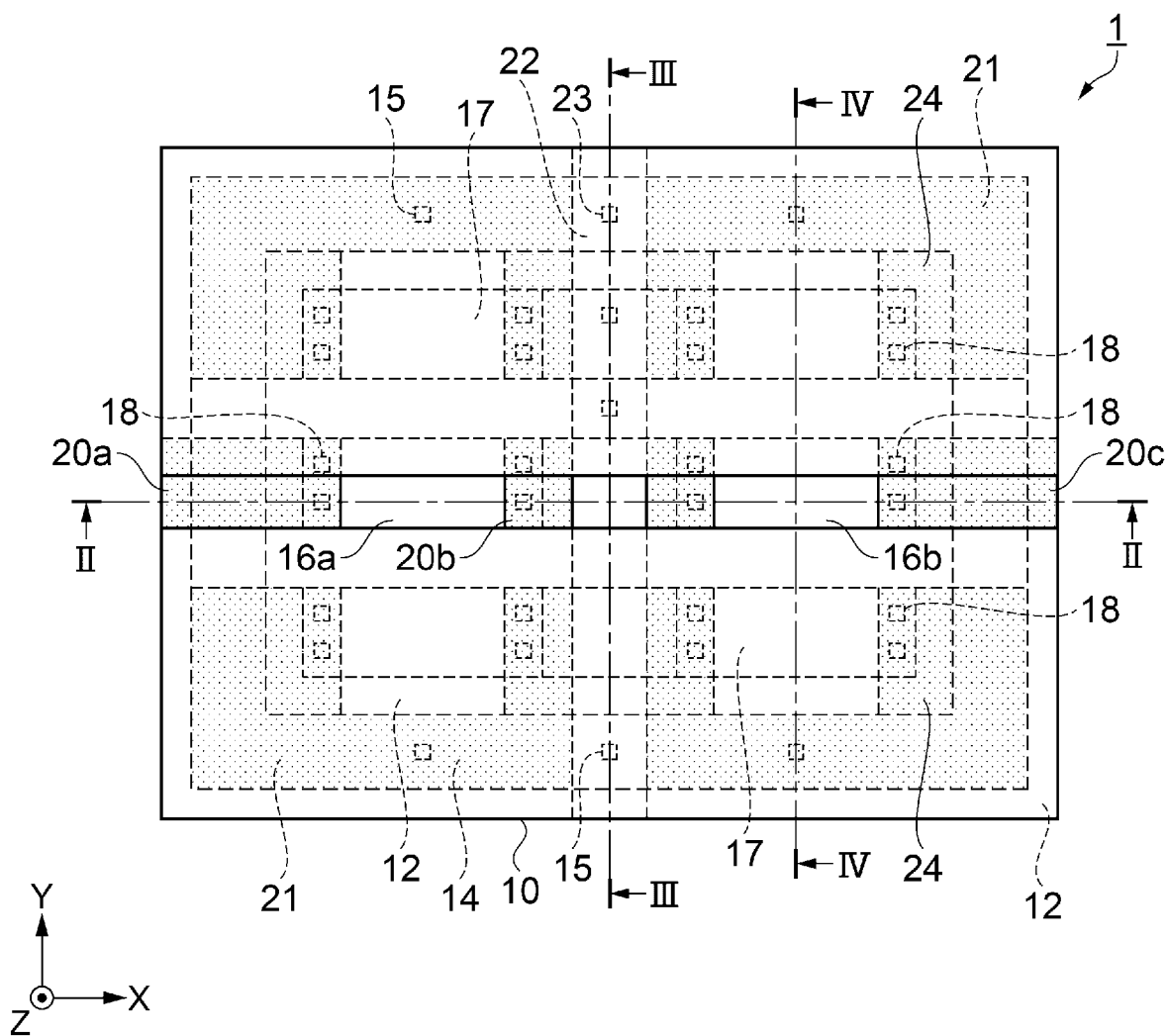
FIG. 1 is a plan view illustrating a schematic configuration of a semiconductor device according to a first embodiment.
Figure 2:
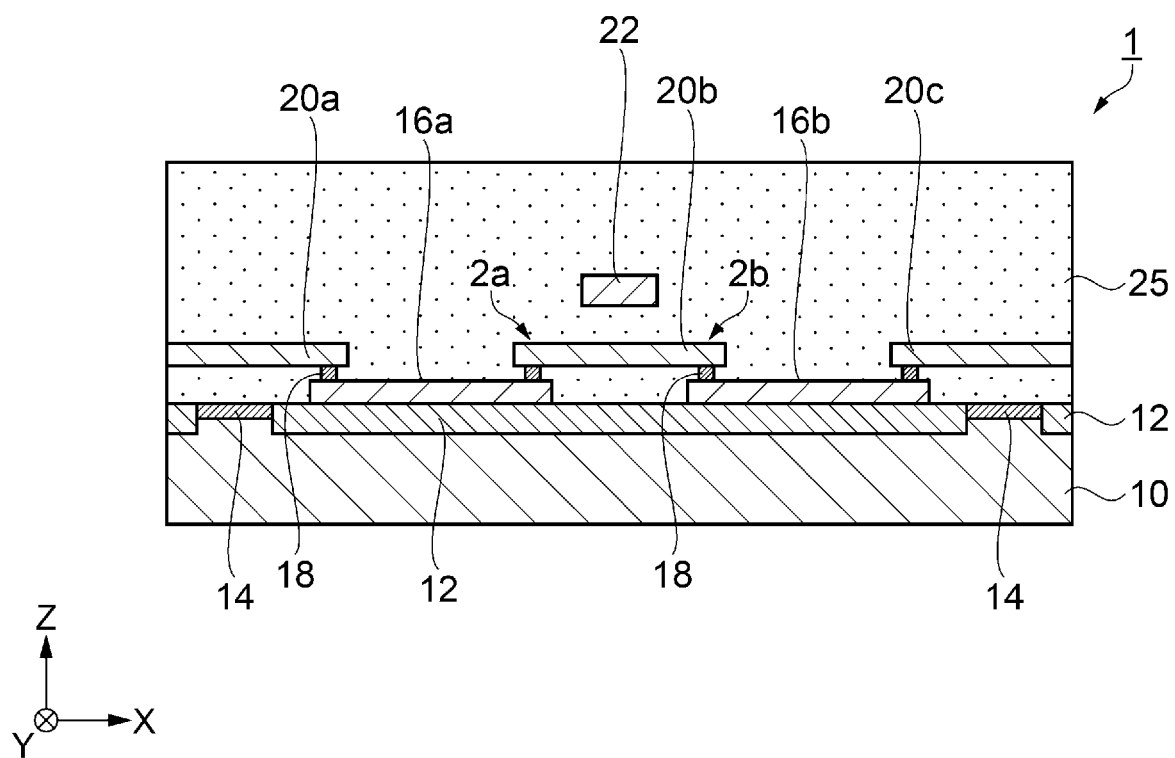
FIG. 2 is a cross-sectional view taken along a line II-II in FIG. 1.
Figure 3:
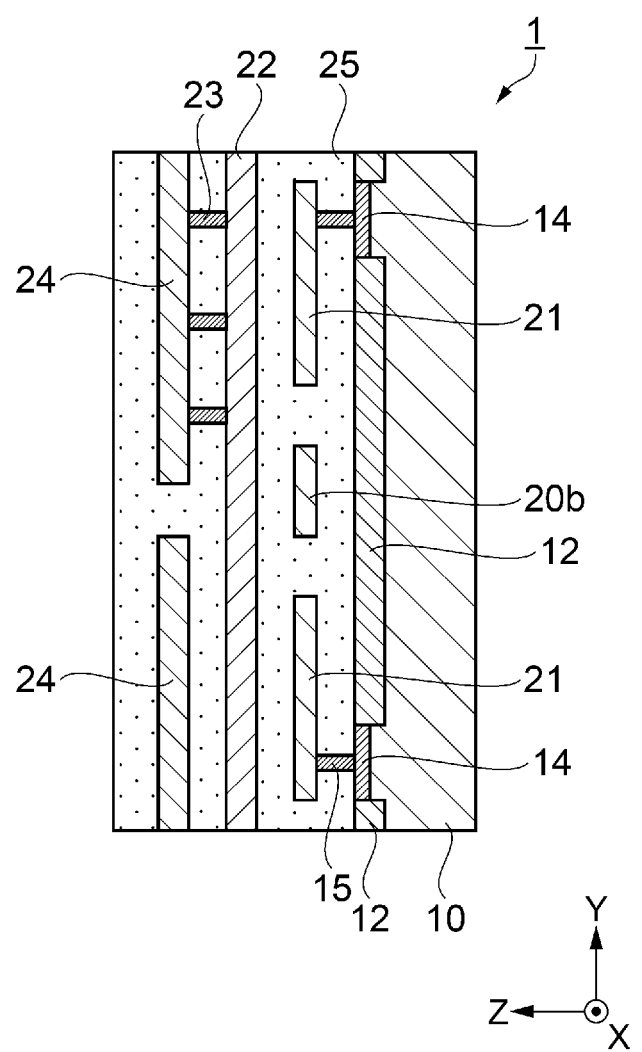
FIG. 3 is a cross-sectional view taken along a line III-III in FIG. 1.
Figure 4:
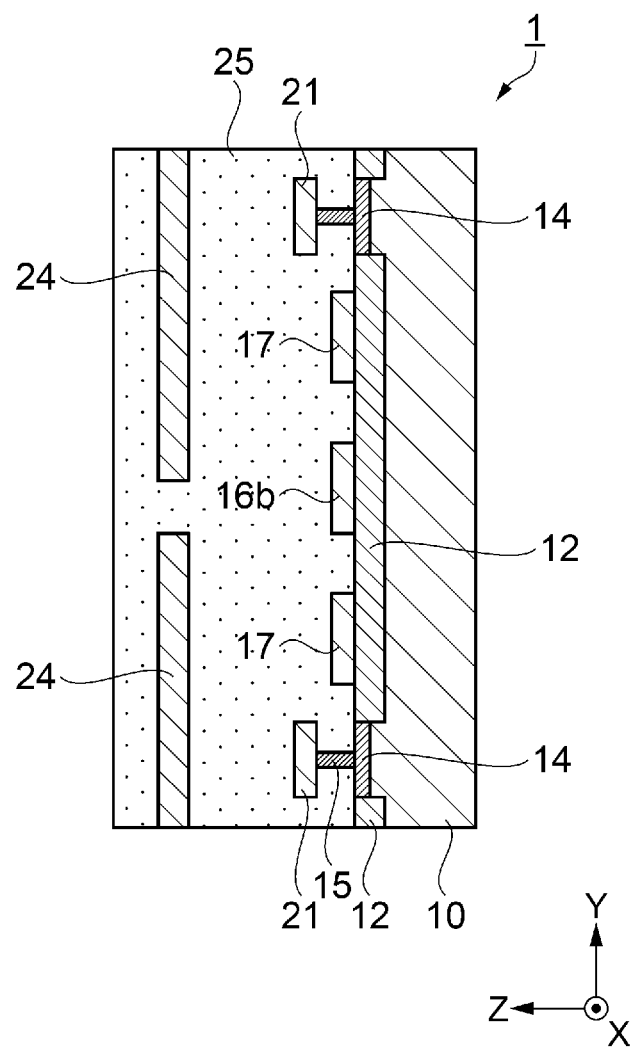
FIG. 4 is a cross-sectional view taken along a line IV-IV in FIG. 1.
Figure 5:
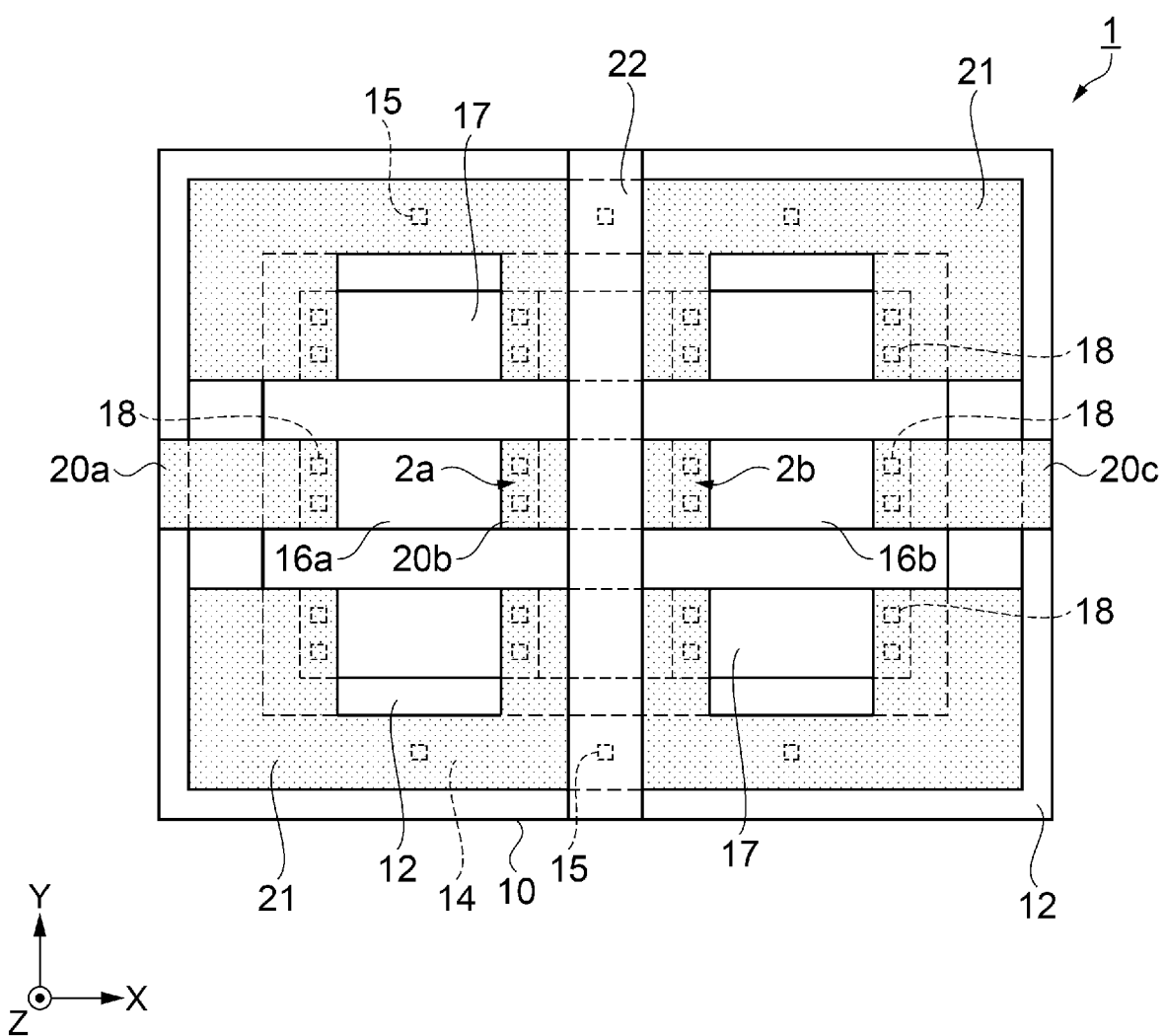
FIG. 5 is a plan view illustrating a schematic configuration of the semiconductor device according to the first embodiment.

FIG. 1 is a plan view illustrating a schematic configuration of the semiconductor device 1 according to the first embodiment. FIG. 2 is a cross-sectional view taken along a line II-II in FIG. 1, FIG. 3 is a cross-sectional view taken along a line III-III in FIG. 1, and FIG. 4 is a cross-sectional view taken along a line IV-IV in FIG. 1. FIG. 5 is a plan view illustrating a schematic configuration of the semiconductor device 1 according to the first embodiment. For the sake of clarity, an insulation film 25 is not illustrated in FIG. 1, and the insulation film 25, a shield pattern 24, and a conduction wiring 23 are not illustrated in FIG. 5. In addition, in each of the following drawings, some configuration elements are omitted for the convenience of description. In addition, for the sake of easy understanding in each drawing, the dimensional ratio of each configuration element is different from actual dimension. In addition, an X axis, Y axis, and Z axis in the drawings are coordinate axes that are orthogonal to each other, and the direction along the X axis is the "X direction", the direction along the Y axis is the "Y direction", and the direction along the Z axis is "Z direction", and the direction of the arrow is the positive direction. In addition, the positive direction of the Z axis is defined as "upper part" or "upper layer", and the negative direction is defined as "lower part" or "lower layer". Furthermore, in the present embodiment, a first axis will be described as the X axis and a second axis will be described as the Y axis.

The semiconductor device 1 illustrated in FIG. 1 is an oscillation circuit with low current consumption, which uses a high resistance pattern for wiring. In the present embodiment, description of analog circuits and digital circuits that configure the oscillation circuit will be omitted, and a high resistance wiring including the high resistance pattern as a part thereof, will be described in detail. In the present embodiment, the "high resistance" will be described under a definition as a sheet resistance of 10 kΩ/□ or higher.

As illustrated in FIGS. 1 to 5, the semiconductor device 1 includes a first high resistance pattern 16a and a second high resistance pattern 16b, which are disposed along the X axis on an upper part of the substrate 10 and are separated from each other, a coupling pattern 20b coupling the first high resistance pattern 16a and the second high resistance pattern 16b, and a signal wiring 22 disposed at the layer above the first high resistance pattern 16a, the second high resistance pattern 16b, and the coupling pattern 20b.

On the upper part of the substrate 10 formed by adding a low concentration of impurities to silicon, a trench 12 made of $SiO_2$ and a wiring pattern 14 which is a P-type semiconductor formed by adding a high concentration of impurities are provided.

On the layer above the trench 12, the first high resistance pattern 16a and the second high resistance pattern 16b, which are formed of polysilicon or the like and have a rectangular form with the X direction as a long side, are disposed along the X axis and separated from each other.

On the layer above the first high resistance pattern 16a and the second high resistance pattern 16b, the coupling pattern 20b formed of aluminum or the like and having the rectangular form with the X direction as the long side, is disposed, and at a first portion 2a overlapping an end portion of the first high resistance pattern 16a of the coupling pattern 20b in a plan view, the coupling pattern 20b and the first high resistance pattern 16a are electrically coupled by the conduction wiring 18 formed of tungsten or the like. In addition, at a second portion 2b overlapping the end portion of the second high resistance pattern 16b of the coupling pattern 20b in a plan view, the coupling pattern 20b and the second high resistance pattern 16b are electrically coupled by the conduction wiring 18.

In the two coupling patterns 20a and 20c disposed at the layer above the first high resistance pattern 16a and the second high resistance pattern 16b, the coupling pattern 20a is electrically coupled to the first high resistance pattern 16a by the conduction wiring 18 at a portion overlapping the first high resistance pattern 16a. In addition, the coupling pattern 20c is electrically coupled to the second high resistance pattern 16b by the conduction wiring 18 at a portion overlapping the second high resistance pattern 16b.

Therefore, since the coupling pattern 20a, the first high resistance pattern 16a, the coupling pattern 20b, the second high resistance pattern 16b, and the coupling pattern 20c are electrically coupled by the conduction wiring 18, it is possible to configure the high resistance wiring.

On the layer above the first high resistance pattern 16a, the second high resistance pattern 16b, and the coupling patterns 20a, 20b, and 20c, the signal wiring 22 extending in the Y direction is disposed. In addition, the signal wiring 22 is disposed along the Y axis between an end of the coupling pattern 20b at the first portion 2a side and an end at the second portion 2b side in a plan view. Therefore, the signal wiring 22 is disposed at a position overlapping the coupling pattern 20b in a plan view. That is, since the signal wiring 22 is not disposed at a position overlapping the first high resistance pattern 16a or the second high resistance pattern 16b, the electric field is less likely to be generated between the signal wiring 22 and the first high resistance pattern 16a and the second high resistance pattern 16b, and thus, it is possible to reduce the variations in resistance value of the first high resistance pattern 16a and the second high resistance pattern 16b. In addition, since the signal wiring 22 can be disposed at the layer above the high resistance wiring, the length of the signal wiring 22 can be shortened, and thus, it is possible to reduce the size of the semiconductor device 1.

The signal wiring 22 is configured as, for example, a five-layer structure in which titanium nitride, titanium, aluminum, titanium, and titanium nitride are laminated in this order. In addition, the aluminum in the intermediate layer may contain copper.

On the layer above the signal wiring 22, a shield pattern 24 formed of aluminum or the like is disposed so as to cover entire of the first high resistance pattern 16a, the second high resistance pattern 16b, and the coupling patterns 20a, 20b, and 20c except a part thereof in a plan view. By providing the shield pattern 24, the influence of an external noise is prevented. As illustrated in FIG. 3, the shield pattern 24 is electrically coupled to the signal wiring 22 by the conduction wiring 23 formed of tungsten or the like.

An insulation film 25 formed of $SiO_2$ or the like is formed at the layer above the shield pattern 24 and between each layer. In addition, as illustrated in FIG. 5, at the positive side and the negative side in the Y direction of the coupling patterns 20a, 20b, and 20c configuring the high resistance wiring, the first high resistance pattern 16a, and the second high resistance pattern 16b, a dummy high resistance pattern 17 and a dummy coupling pattern 21 are respectively disposed, and the dummy high resistance pattern 17 and the dummy coupling pattern 21 are electrically coupled by the conduction wiring 18. In addition, as illustrated in FIGS. 3 and 4, the dummy coupling pattern 21 is electrically coupled to a wiring pattern 14 by the dummy conduction wiring 15.

These dummy patterns are patterns for forming the high resistance wiring with high accuracy, and also have a function of shielding the high resistance wiring. The constituent materials of the dummy high resistance pattern 17, the dummy coupling pattern 21, and the dummy conduction wiring 15 are the same as those of the first high resistance pattern 16a, the second high resistance pattern 16b, the coupling pattern 20b, and the conduction wiring 18 that configure the high resistance wiring.

As described above, in the semiconductor device 1 in the present embodiment, since the signal wiring 22 is disposed at the layer above the coupling pattern 20b that couples the first high resistance pattern 16a and the second high resistance pattern 16b, and the signal wiring 22 does not overlap the first high resistance pattern 16a and the second high resistance pattern 16b in a plan view, the electric field is less likely to be generated between the signal wiring 22 and the first high resistance pattern 16a and the second high resistance pattern 16b, and thus, it is possible to reduce the variations in resistance value of the first high resistance pattern 16a and the second high resistance pattern 16b. Therefore, the length of the signal wiring 22 can be shortened, and it is possible to reduce the size of the semiconductor device 1. Furthermore, it is possible to provide the semiconductor device 1 having an oscillation circuit driven with a low current consumption.

2. Second Embodiment

Next, a semiconductor device 1a according to a second embodiment will be described with reference to FIGS. 6 to 8.

Figure 6:
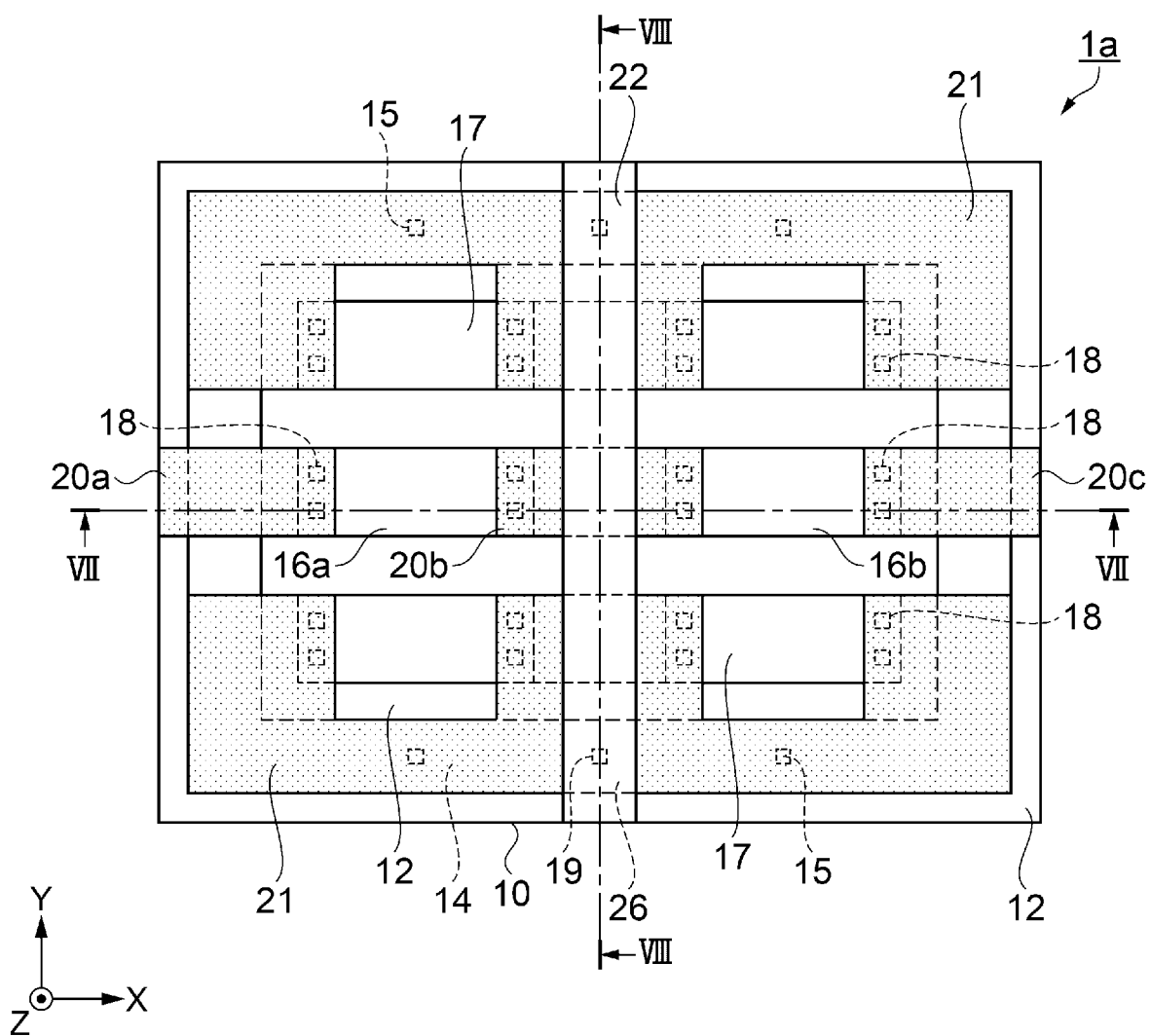
FIG. 6 is a plan view illustrating a schematic configuration of a semiconductor device according to a second embodiment.

FIG. 6 is a plan view illustrating a schematic configuration of the semiconductor device 1a according to the second embodiment. FIG. 7 is a cross-sectional view taken along a line VII-VII in FIG. 6, and FIG. 8 is a cross-sectional view taken along a line VIII-VIII in FIG. 6. In FIG. 6, the illustration of the insulation film 25, the shield pattern 24, and the conduction wiring 23 is omitted for clarity.

The semiconductor device 1a in the present embodiment is similar to the semiconductor device 1 in the first embodiment except that a shield pattern 26 is provided between the signal wiring 22 and the coupling pattern 20b. The description will be focused on the differences from the first embodiment described above, and the descriptions of the same items will not be repeated. In addition, in FIGS. 6 to 8, the same reference numerals will be given to the same configuration elements in the embodiment described above.

Figure 7:
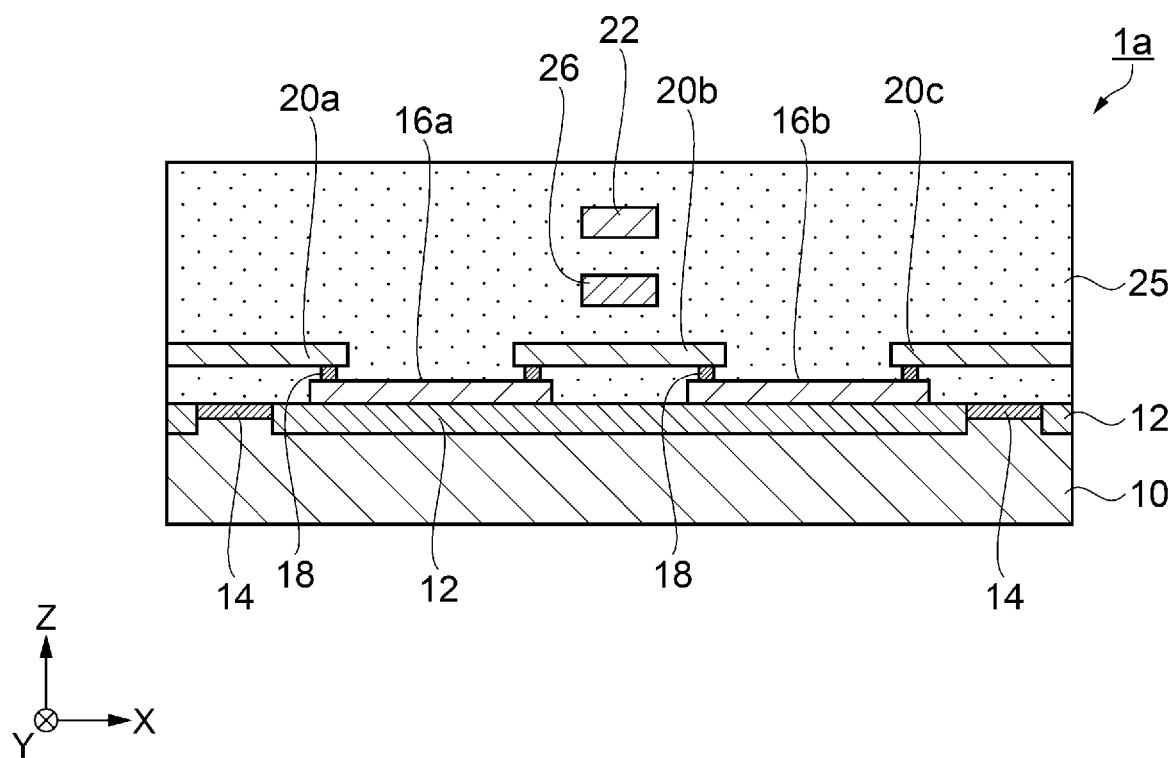
FIG. 7 is a cross-sectional view taken along a line VII-VII in FIG. 6.
Figure 8:
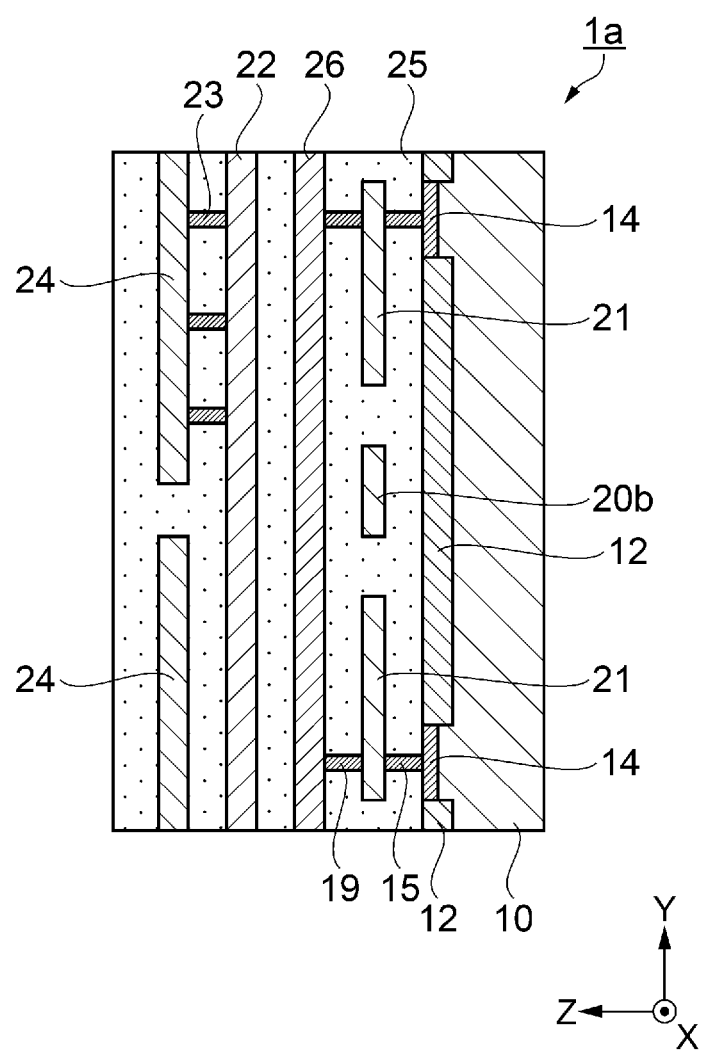
FIG. 8 is a cross-sectional view taken along a line VIII-VIII in FIG. 6.

As illustrated in FIGS. 6 to 8, in the semiconductor device 1a, a shield pattern 26 extending in the Y direction is disposed at the layer above the coupling pattern 20b and below the signal wiring 22, and at a position overlapping the signal wiring 22 in a plan view. The shield pattern 26 formed of aluminum or the like is electrically coupled to the dummy coupling pattern 21 by the conduction wiring 19 formed of tungsten or the like, and is electrically coupled to the wiring pattern 14 provided at the upper part of the substrate 10 via the dummy coupling pattern 21 and the dummy conduction wiring 15.

When the wiring pattern 14 is electrically coupled to a ground potential of a first power supply (not illustrated) that is a power source of a circuit including the first high resistance pattern 16a and the second high resistance pattern 16b, such as Vss, or electrically coupled to a constant potential of the first power supply (not illustrated) such as a power supply potential, the shield pattern 26 is electrically coupled to the ground potential of the first power supply or the constant potential of the first power supply. Therefore, the shield pattern 26, the first high resistance pattern 16a, and the second high resistance pattern 16b have the same potentials, and since the shield pattern 26 is disposed at a position overlapping the signal wiring 22 in a plan view, the electric field is less likely to be generated between the signal wiring 22 and the first high resistance pattern 16a and the second high resistance pattern 16b having different potentials, and thus, it is possible to further reduce the variations in the resistance value of the first high resistance pattern 16a and the second high resistance pattern 16b.

3. Third Embodiment

Next, a semiconductor device 1b according to a third embodiment will be described with reference to FIGS. 9 and 10.

Figure 9:
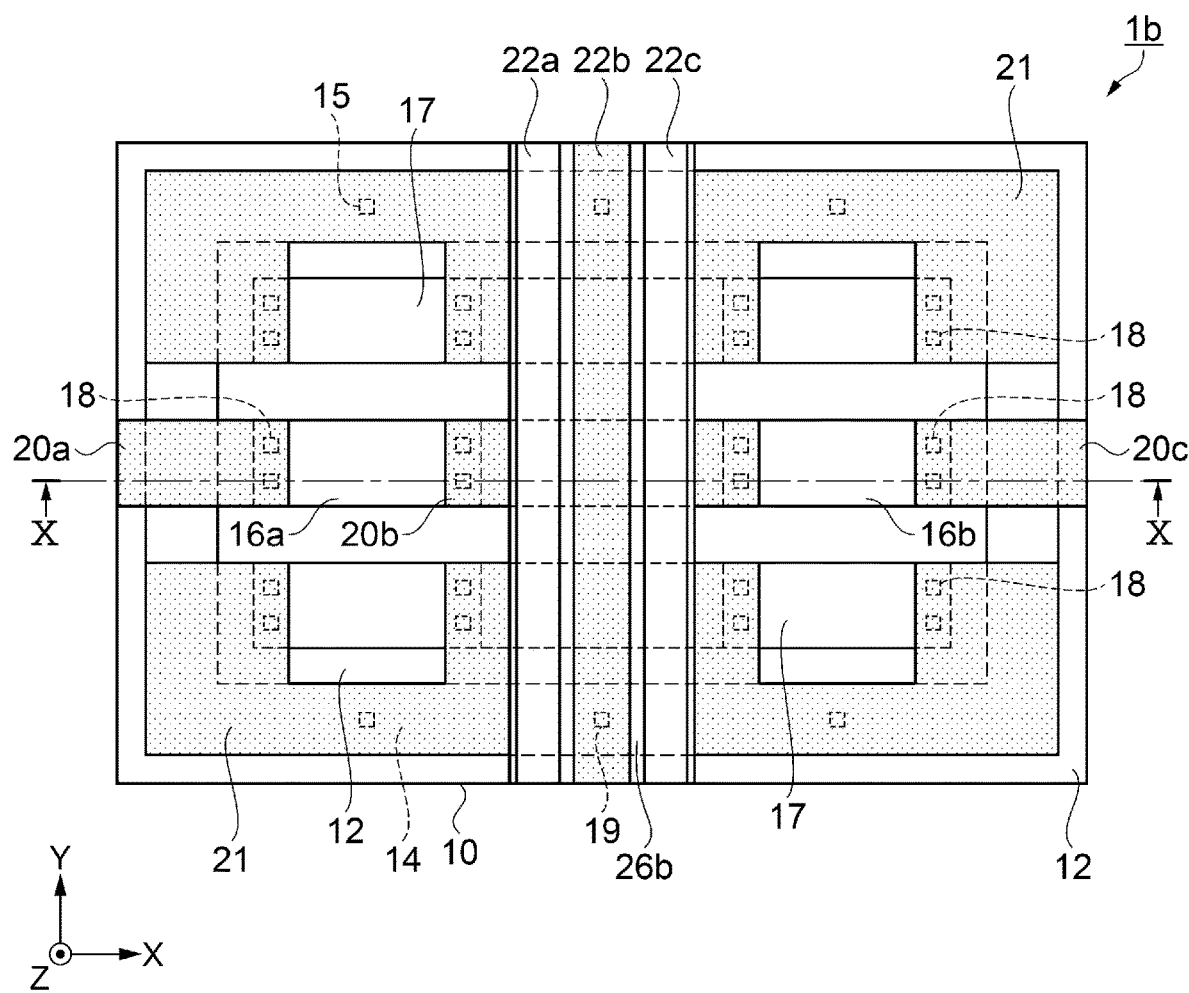
FIG. 9 is a plan view illustrating a schematic configuration of a semiconductor device according to a third embodiment.

FIG. 9 is a plan view illustrating a schematic configuration of the semiconductor device 1b according to the third embodiment. FIG. 10 is a cross-sectional view taken along a line X-X in FIG. 9. In FIG. 9, the insulation film 25, the shield pattern 24, and the conduction wiring 23 are not illustrated for clarity.

The semiconductor device 1b in the present embodiment is similar to the semiconductor device 1 in the first embodiment except that a first signal wiring 22a, a second signal wiring 22b, and a third signal wiring 22c are provided at the shield pattern 26b and at the layer above the shield pattern 26b. The description will be focused on the differences from the first embodiment described above, and the descriptions of the same items will not be repeated. In addition, in FIGS. 9 and 10, the same reference numerals will be given to the same configuration elements in the embodiment described above.

Figure 10:
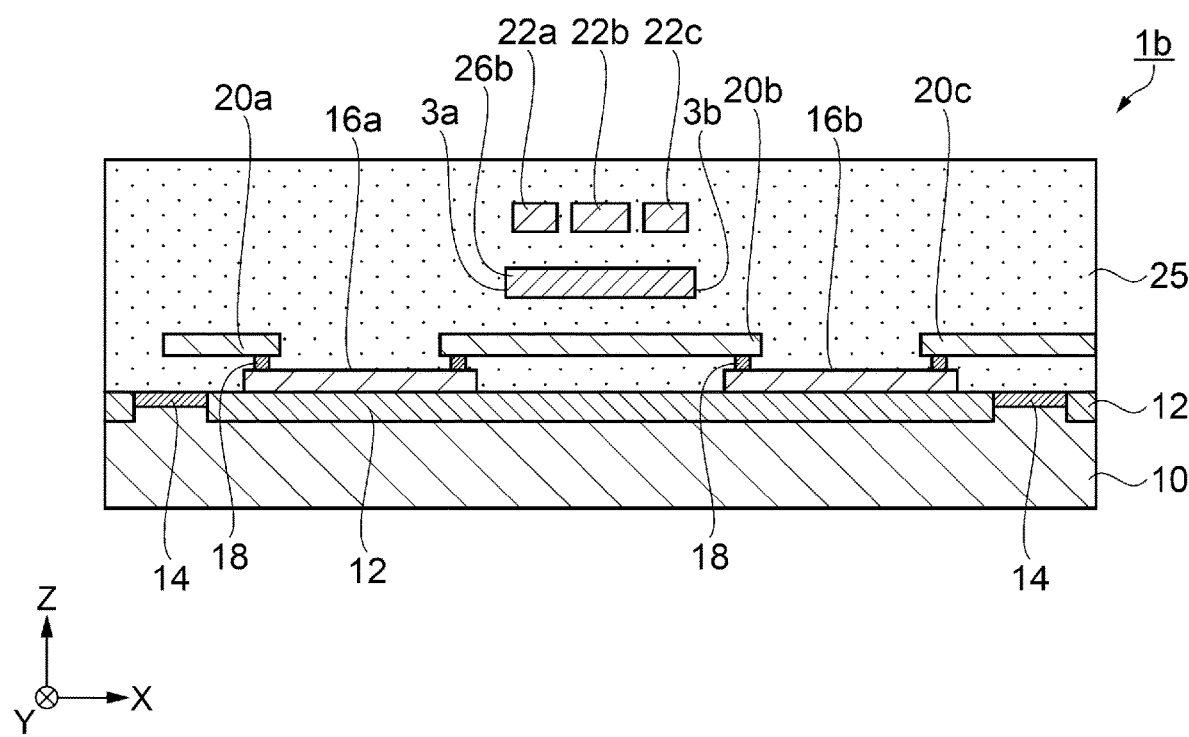
FIG. 10 is a cross-sectional view taken along a line X-X in FIG. 9.

As illustrated in FIGS. 9 and 10, in the semiconductor device 1b in the present embodiment, the first signal wiring 22a, the second signal wiring 22b, and the third signal wiring 22c respectively extending along the Y direction and in a sequential manner in the X direction, are disposed at the layer above the shield pattern 26b. In addition, the first signal wiring 22a, the second signal wiring 22b, and the third signal wiring 22c are disposed between the first end portion 3a and the second end portion 3b of the shield pattern 26b at the positions overlapping the shield pattern 26b in a plan view.

The shield pattern 26b is electrically coupled to the ground potential of the first power supply (not illustrated), which is the power supply of the circuit including the first high resistance pattern 16a and the second high resistance pattern 16b, or coupled to the constant potential of the first power supply (not illustrated), via the conduction wiring 19. In addition, the first signal wiring 22a and the third signal wiring 22c are electrically coupled to the ground potential of the second power supply (not illustrated), which is the power supply of the circuit that supplies the signal of the second signal wiring 22b, or to the constant potential of the second power supply (not illustrated), via the conduction wiring 23 illustrated in FIG. 8.

Therefore, since the shield pattern 26b, the first high resistance pattern 16a, and the second high resistance pattern 16b have the same potentials, the electric field is less likely to be generated between the first signal wiring 22a and the third signal wiring 22c each having different electric potentials, and the first high resistance pattern 16a and the second high resistance pattern 16b respectively, by disposing the first signal wiring 22a, the second signal wiring 22b, and the third signal wiring 22c each having different potentials between the first end portion 3a and the second end portion 3b of the shield pattern 26b, and thus it is possible to reduce the variations in resistance value of the first high resistance pattern 16a and the second high resistance pattern 16b.

4. Fourth Embodiment

Next, a semiconductor device 1c according to a fourth embodiment will be described.

In the semiconductor device 1c in the present embodiment, similarly to the configuration of the semiconductor device 1b in the third embodiment, the first signal wiring 22a, the second signal wiring 22b, and the third signal wiring 22c are disposed at the shield pattern 26b and at the layer above the shield pattern 26b, however, the first signal wiring 22a and the third signal wiring 22c are coupled to the shield pattern 26b so as to have the same potential. Therefore, description will be made with reference to FIGS. 9 and 10.

The shield pattern 26b is electrically coupled to the ground potential of the first power supply (not illustrated), which is the power supply of the circuit including the first high resistance pattern 16a and the second high resistance pattern 16b, or to the constant potential of the first power supply (not illustrated), via the conduction wiring 19. In addition, the first signal wiring 22a and the third signal wiring 22c are electrically coupled to the ground potential of the second power supply (not illustrated), which is the power supply of the circuit that supplies the signal of the second signal wiring 22b, or to the constant potential of the second power supply (not illustrated), via the conduction wiring 23 illustrated in FIG. 8.

The shield pattern 26b is electrically coupled to the ground potential of the first power supply, which is the power supply of the circuit including the first high resistance pattern 16a and the second high resistance pattern 16b, or to the constant potential of the first power supply, via the conduction wiring 19. Similarly to the shield pattern 26b, the first signal wiring 22a and the third signal wiring 22c are also electrically coupled to the ground potential of the first power supply or to the constant potential of the first power supply.

Therefore, since the shield pattern 26b, the first high resistance pattern 16a, the second high resistance pattern 16b, the first signal wiring 22a, and the third signal wiring 22c have the same potentials, the second signal wiring 22b having a different potential can be interposed between the first signal wiring 22a and the third signal wiring 22c by disposing the second signal wiring 22b having the different potential between the first end portion 3a and the second end portion 3b of the shield pattern 26b. Therefore, the electric field is less likely to be generated between the second signal wiring 22b, and the first high resistance pattern 16a and the second high resistance pattern 16b, and thus, it is possible to reduce the variations in resistance value of the first high resistance pattern 16a and the second high resistance pattern 16b.

5. Fifth Embodiment

Next, a semiconductor device 1d according to a fifth embodiment will be described with reference to FIGS. 11 and 12.

Figure 11:
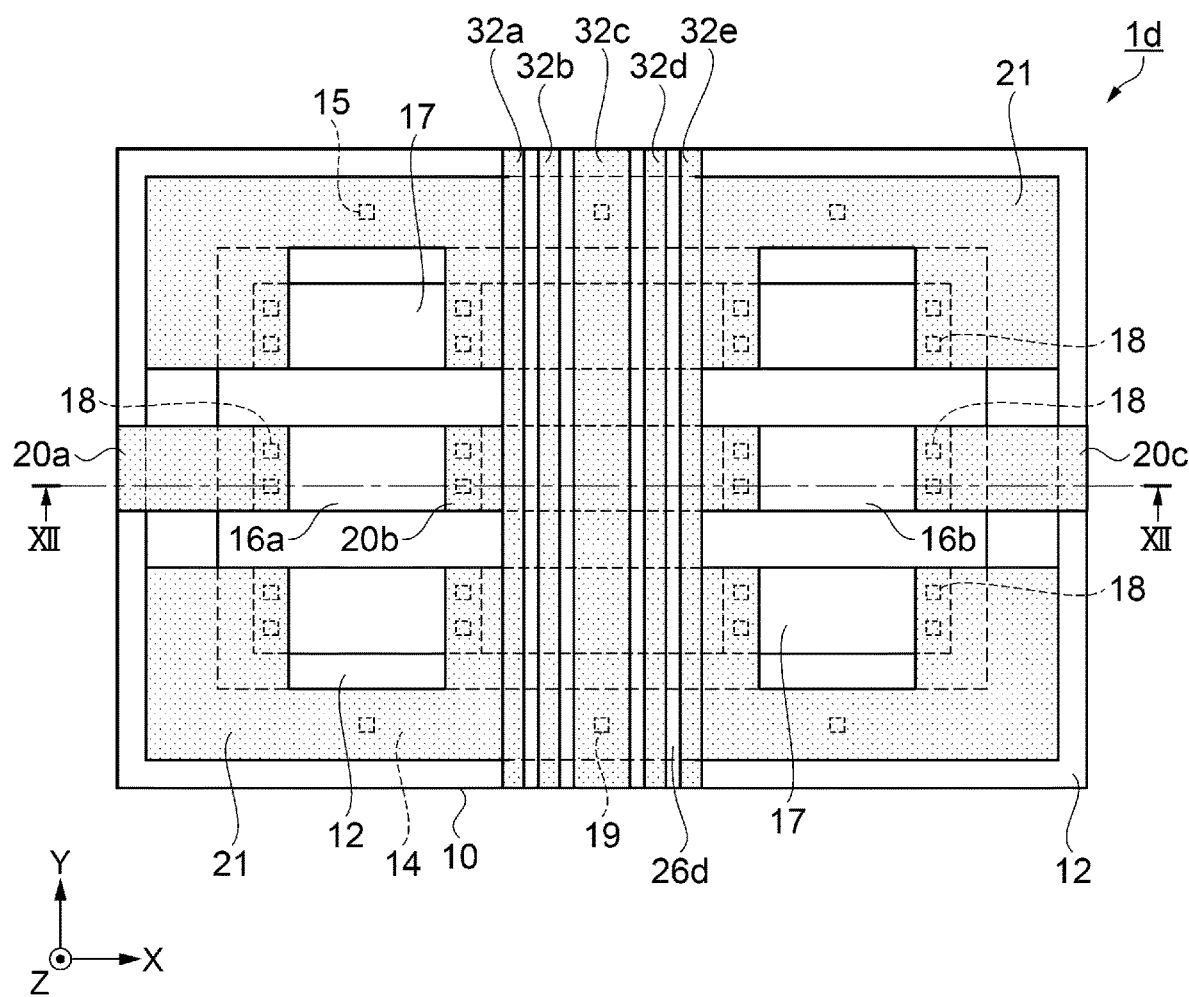
FIG. 11 is a plan view illustrating a schematic configuration of a semiconductor device according to a fifth embodiment.

FIG. 11 is a plan view illustrating a schematic configuration of the semiconductor device 1d according to the fifth embodiment. FIG. 12 is a cross-sectional view taken along a line XII-XII in FIG. 11. In FIG. 11, the illustration of the insulation film 25, the shield pattern 24, and the conduction wiring 23 is omitted for clarity.

The semiconductor device 1d in the present embodiment is the same as the semiconductor device 1 in the first embodiment except that the semiconductor device 1d includes a shield pattern 26d and a first signal wiring 32a, a second signal wiring 32b, a third signal wiring 32c, a fourth signal wiring 32d, and a fifth signal wiring 32e at layer above the shield pattern 26d. The description will be focused on the differences from the first embodiment described above, and the descriptions of the same items will not be repeated. In addition, in FIGS. 11 and 12, the same reference numerals will be given to the same configuration elements in the embodiment described above.

Figure 12:
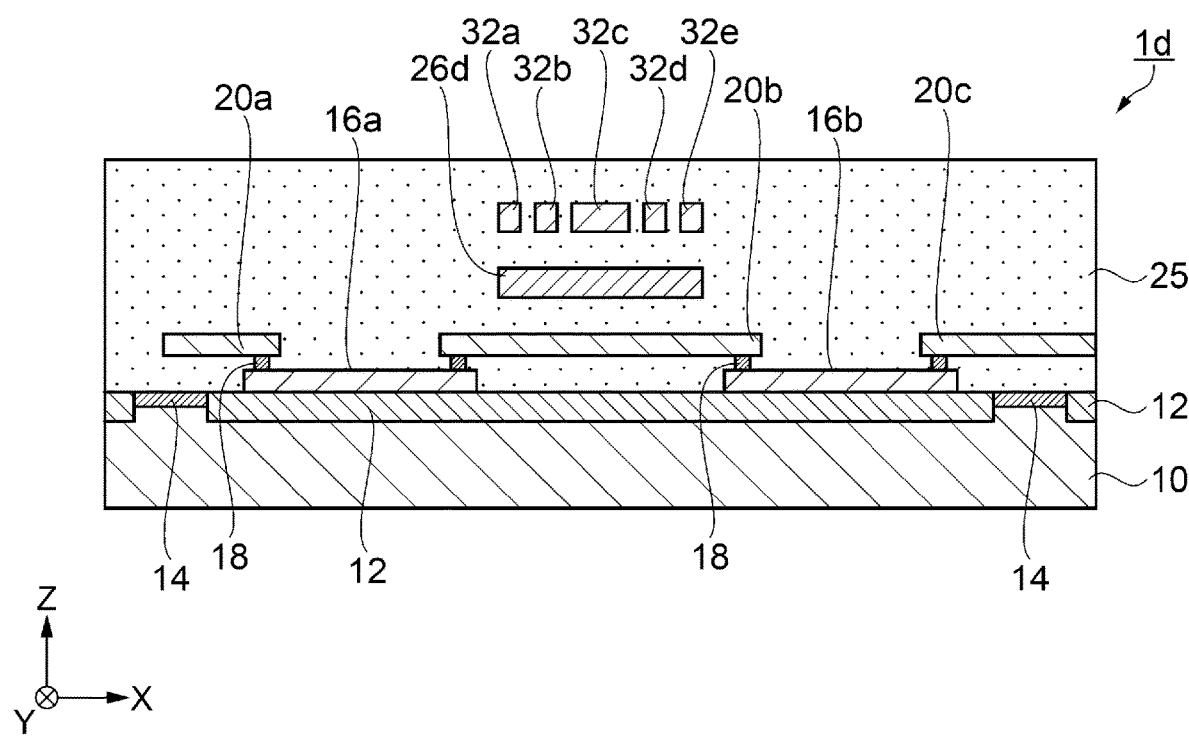
FIG. 12 is a cross-sectional view taken along a line XII-XII in FIG. 11.

As illustrated in FIGS. 11 and 12, in the semiconductor device 1d, the first signal wiring 32a, the second signal wiring 32b, the third signal wiring 32c, the fourth signal wiring 32d, and the fifth signal wiring 32e respectively extending in the Y direction are disposed at the layer above the shield pattern 26d in a sequential manner in the X direction. In addition, the first signal wiring 32a, the second signal wiring 32b, the third signal wiring 32c, the fourth signal wiring 32d, and the fifth signal wiring 32e are disposed at the positions overlapping the shield pattern 26d in a plan view.

The shield pattern 26d, the first signal wiring 32a, and fifth signal wiring 32e are electrically coupled to the ground potential of the first power supply (not illustrated), which is the power supply of the circuit including the first high resistance pattern 16a and the second high resistance pattern 16b or to the constant potential of the first power supply (not illustrated), via the conduction wiring 19 or the like. In addition, the second signal wiring 32b and the fourth signal wiring 32d are electrically coupled to the ground potential of the second power supply (not illustrated) or to the constant potential of the second power supply (not illustrated), which is power supply of the circuit supplying the signal of the third signal wiring 32c, via the conduction wiring 23 illustrated in FIG. 8.

Therefore, since the shield pattern 26d, the first high resistance pattern 16a, the second high resistance pattern 16b, the first signal wiring 32a, and the fifth signal wiring 32e have the same potentials, the electric field is less likely to be generated between the second signal wiring 32b, the third signal wiring 32c, and the fourth signal wiring 32d, and the first high resistance pattern 16a and the second high resistance pattern 16b respectively, by interposing the second signal wiring 32b, the third signal wiring 32c, and the fourth signal wiring 32d having the different potentials between the first signal wiring 32a and the fifth signal wiring 32e, and thus, it is possible to reduce the variations in resistance value of the first high resistance pattern 16a and the second high resistance pattern 16b.

6. Sixth Embodiment

Next, a semiconductor device 1e according to a sixth embodiment will be described with reference to FIGS. 13 and 14.

Figure 13:
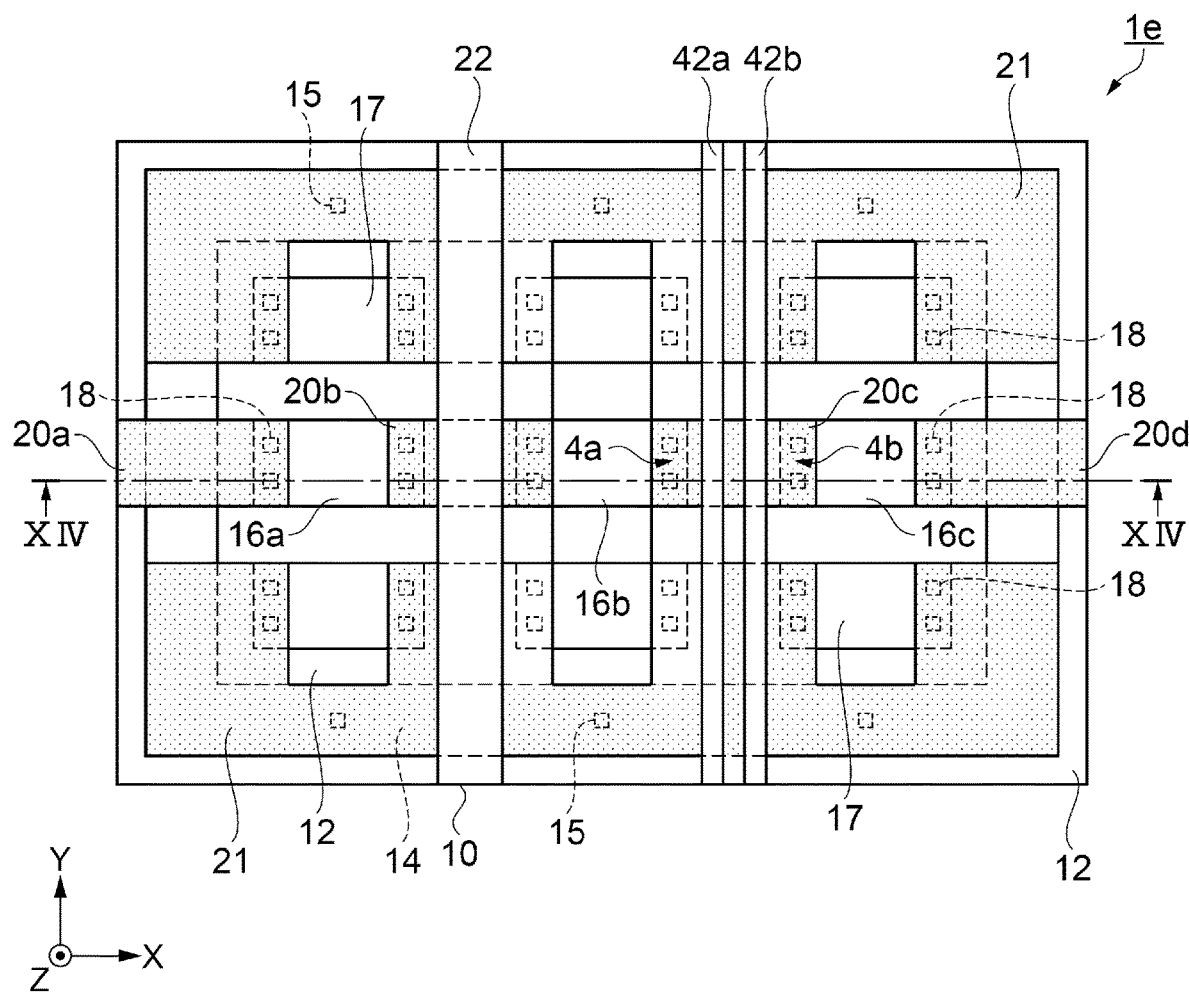
FIG. 13 is a plan view illustrating a schematic configuration of a semiconductor device according to a sixth embodiment.
Figure 14:
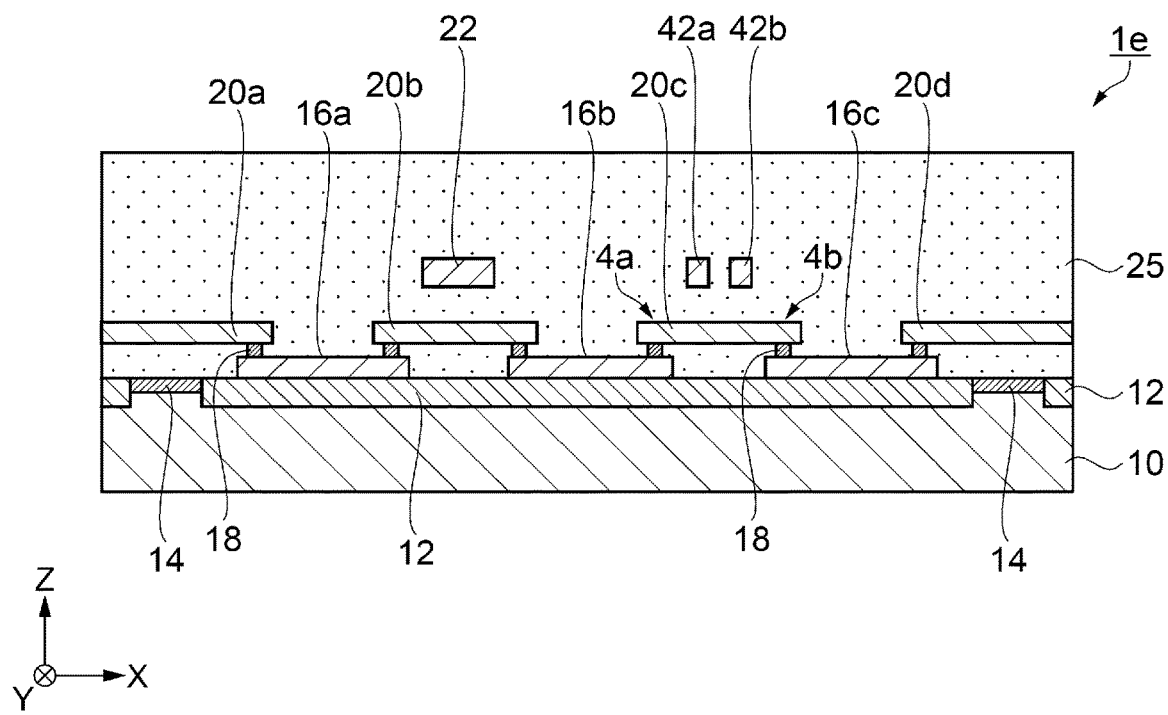
FIG. 14 is a cross-sectional view taken along a line XIV-XIV in FIG. 13.

FIG. 13 is a plan view illustrating a schematic configuration of the semiconductor device 1e according to the sixth embodiment. FIG. 14 is a cross-sectional view taken along a line XIV-XIV in FIG. 13. In FIG. 13, the insulation film 25, the shield pattern 24, and the conduction wiring 23 are not illustrated for clarity.

In the semiconductor device 1e in the present embodiment, a third high resistance pattern 16c, a coupling pattern 20d, and two second signal wirings 42a and 42b are provided in addition to the configuration members of the semiconductor device 1 in the first embodiment. The description will be focused on the differences from the first embodiment described above, and the descriptions of the same items will not be repeated. In addition, in FIGS. 13 and 14, the same reference numerals will be given to the same configuration elements in the embodiment described above.

In the semiconductor device 1e, a rectangular shaped first high resistance pattern 16a, a second high resistance pattern 16b, and a third high resistance pattern 16c with the X direction as long sides are disposed at the layer above the trench 12 of the substrate 10 along the X axis while being separated from each other.

A coupling pattern 20c as a rectangular shaped second coupling pattern with the X direction as the long side, is disposed at the upper layers of the second high resistance pattern 16b and the third high resistance pattern 16c, and the coupling pattern 20c and the second high resistance pattern 16b are electrically coupled to each other by the conduction wiring 18 at the third portion 4a of the coupling pattern 20c, which overlaps the end portion of the second high resistance pattern 16b in a plan view. In addition, the coupling pattern 20c and the third high resistance pattern 16c are electrically coupled to each other by the conduction wiring 18 at a fourth portion 4b of the coupling pattern 20c, which overlaps the end portion of the third high resistance pattern 16c in a plan view.

Furthermore, the coupling pattern 20d disposed at the layer above the third high resistance pattern 16c is electrically coupled to the third high resistance pattern 16c by the conduction wiring 18 at the portion where the coupling pattern 20d overlaps the third high resistance pattern 16c.

Therefore, since the coupling pattern 20a, the first high resistance pattern 16a, the coupling pattern 20b, the second high resistance pattern 16b, the coupling pattern 20c, the third high resistance pattern 16c, and the coupling pattern 20d are electrically coupled by the conduction wiring 18, it is possible to configure the high resistance wiring.

Two second signal wirings 42a and 42b extending in the Y direction are disposed at the layer above the second high resistance pattern 16b, the third high resistance pattern 16c, and the coupling pattern 20c. In addition, the second signal wirings 42a and 42b are disposed along the Y axis between the end of the coupling pattern 20c at the third portion 4a side and the end of the coupling pattern 20c at the fourth portion 4b side in a plan view. Therefore, the electric field is less likely to be generated between the second signal wirings 42a and 42b, and the second high resistance pattern 16b and the third high resistance pattern 16c respectively, and thus it is possible to reduce the variations in the resistance value of the second high resistance pattern 16b and the third high resistance pattern 16c. Since the second signal wirings 42a and 42b can also be disposed at the layer above the high resistance wiring in addition to the signal wiring 22, the lengths of the signal wiring 22 and the second signal wirings 42a and 42b can be shortened, and thus, the size of the semiconductor device 1e can be reduced.

As described above, since the second signal wirings 42a and 42b can be disposed also at the layer above the coupling pattern 20c as the second coupling pattern that couples the second high resistance pattern 16b and the third high resistance pattern 16c, it is possible to provide the small type semiconductor device 1e in which many signal wirings are disposed at the layer above the high resistance wiring.

7. Seventh Embodiment

Next, an oscillator 1000 according to a seventh embodiment including the semiconductor devices 1, 1a, 1b, 1c, 1d, and 1e will be described. In the following description, a configuration to which the semiconductor device 1 is applied will be described as an example.

Figure 15:
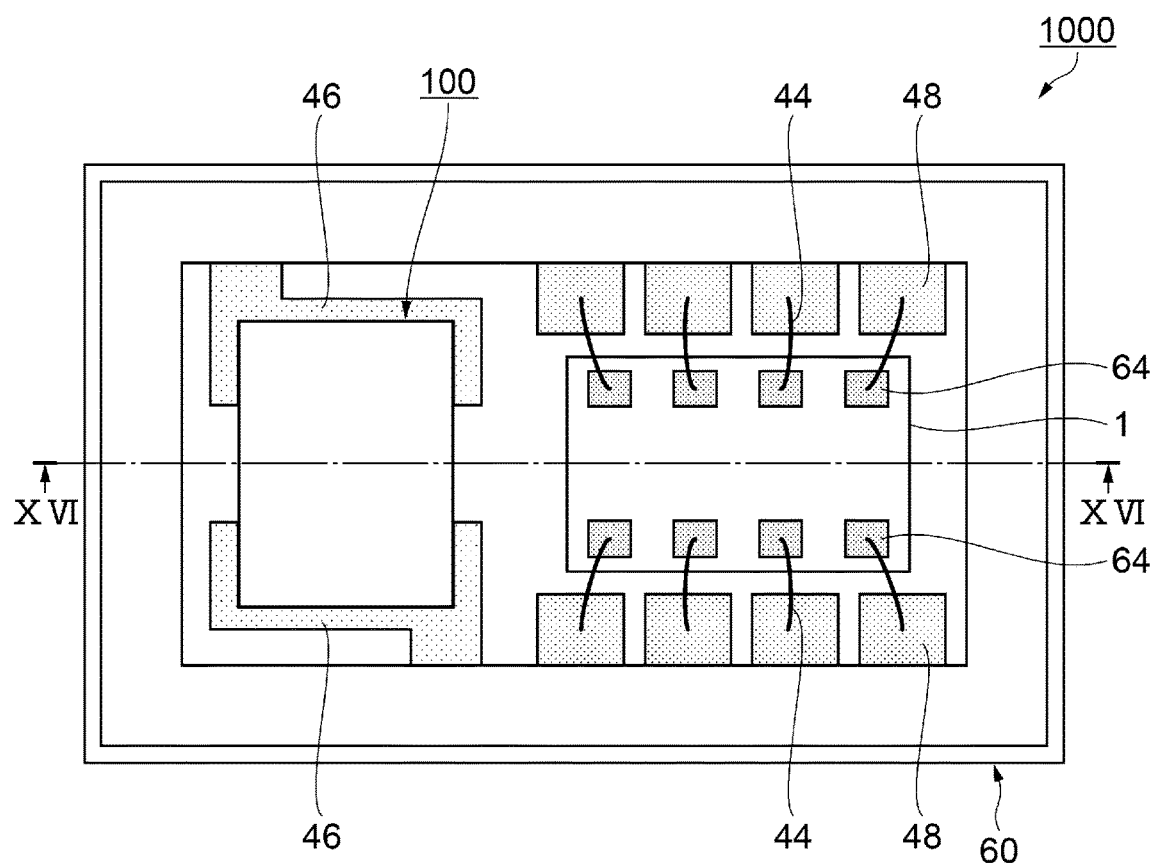
FIG. 15 is a plan view illustrating a schematic configuration of an oscillator according to a seventh embodiment.
Figure 16:
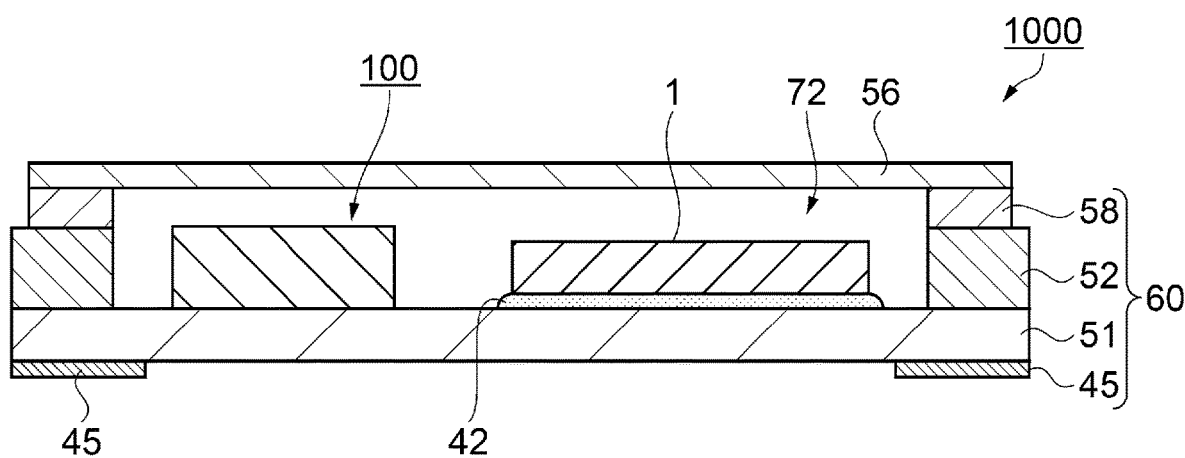
FIG. 16 is a cross-sectional view taken along a line XVI-XVI in FIG. 15.

FIG. 15 is a plan view illustrating a schematic structure of the oscillator 1000 according to the seventh embodiment. FIG. 16 is a cross-sectional view taken along a line XVI-XVI in FIG. 15.

The oscillator 1000 includes a vibrator 100, the semiconductor device 1 including an oscillation circuit for driving the vibrator 100, a package main body 60 for accommodating the vibrator 100 and the semiconductor device 1, and a lid member 56 made of glass, ceramic, metal, or the like.

As illustrated in FIG. 16, the package main body 60 is formed by laminating a mounting terminal 45, a first substrate 51, a second substrate 52, and a seal ring 58. In addition, the package main body 60 has a cavity 72 opened to the upper part. The inside of the cavity 72 that accommodates the vibrator 100 and the semiconductor device 1 is hermetically sealed in a reduced pressure atmosphere or an inert gas atmosphere such as nitrogen by joining a lid member 56 with a seal ring 58.

A plurality of mounting terminals 45 are provided on the outer bottom surface of the first substrate 51. In addition, the mounting terminal 45 is electrically coupled to a coupling electrode 46 and a coupling terminal 48 provided at the upper part of the first substrate 51 through a through electrode (not illustrated) and an interlayer wiring.

In the cavity 72 of the package main body 60, the vibrator 100 and the semiconductor device 1 are accommodated. The vibrator 100 is fixed to the coupling electrode 46 provided at the upper part of the first substrate 51 via soldering or a conductive adhesive. The semiconductor device 1 is fixed to the upper part of the first substrate 51 via a joining member 42 such as a brazing material or an adhesive. In addition, a plurality of coupling terminals 48 are provided in the cavity 72. The coupling terminal 48 is electrically coupled to the coupling terminal 64 provided at the upper part of the semiconductor device 1 by the bonding wire 44.

The semiconductor device 1 includes an oscillation circuit for controlling the driving of the vibrator 100 and a high resistance wiring that enables low current consumption, and it is possible to drive the vibrator 100 with a low current consumption and extract a signal of a predetermined frequency using the semiconductor device 1.

Since the oscillator 1000 includes the semiconductor device 1 described above, the effects described in the above embodiments are reflected, and thus, reducing the size can be excellently achieved with low current consumption.

The contents derived from the embodiments will be described below.

A semiconductor device includes a first high resistance pattern and a second high resistance pattern that are disposed along a first axis and are separated from each other, a coupling pattern that electrically couples the first high resistance pattern and the second high resistance pattern, and a signal wiring disposed at a layer above the first high resistance pattern, the second high resistance pattern, and the coupling pattern. The coupling pattern includes a first portion that overlaps an end portion of the first high resistance pattern in a plan view at a layer above the first high resistance pattern, the coupling pattern includes a second portion that overlaps an end portion of the second high resistance pattern in a plan view at the upper layer from the second high resistance pattern, and the signal wiring is disposed along a second axis that intersects the first axis in a plan view between an end of the coupling pattern at the first portion side and an end of the coupling pattern at the second portion side.

According to this configuration, since the signal wiring is disposed at the layer above the coupling pattern that couples the first high resistance pattern and the second high resistance pattern, and the signal wiring does not overlap the first high resistance pattern and the second high resistance pattern in a plan view, the electric field is less likely to be generated between the signal wiring and the first high resistance pattern and the second high resistance pattern, and thus, it is possible to reduce the variations in resistance value of the first high resistance pattern and the second high resistance pattern. Therefore, the length of the signal wiring can be shortened, and it is possible to reduce the size of the semiconductor device.

In the semiconductor device described above, a shield pattern may be disposed at the layer above the coupling pattern and below the signal wiring, and the shield pattern may be electrically coupled to a ground potential or a constant potential.

According to this configuration, the shield pattern is disposed between the coupling pattern and the signal wiring and the shield pattern is electrically coupled to the ground potential or to the constant potential, and the signal wiring and the shield pattern overlap each other in a plan view. Therefore, the electric field is less likely to be generated between the signal wiring and the first high resistance pattern and the second high resistance pattern, and thus, itis possible to further reduce the variations in the resistance value of the first high resistance pattern and the second high resistance pattern.

In the semiconductor device described above, a shield pattern may be disposed at a layer above the coupling pattern and a layer below the signal wiring, and the shield pattern may be electrically coupled to a ground potential of a first power supply or to a constant potential of the first power supply, which is a power supply of a circuit including the first high resistance pattern and the second high resistance pattern.

According to this configuration, since the shield pattern is disposed between the coupling pattern and the signal wiring and the shield pattern, the first high resistance pattern, and the second high resistance pattern have the same potentials, the electric field is less likely to be generated between the signal wiring having different potential and the first high resistance pattern and the second high resistance pattern, and thus, it is possible to reduce the variations in resistance value of the first high resistance pattern and the second high resistance pattern.

In the semiconductor device described above, it is desirable that a shield pattern is disposed at a layer above the coupling pattern and below the signal wiring, the shield pattern is electrically coupled to a ground potential of the first power supply or to a constant potential of the first power supply, which is a power supply of a circuit including the first high resistance pattern and the second high resistance pattern, the signal wiring includes a first signal wiring, a second signal wiring, and a third signal wiring, which are sequentially disposed along the first axis, the first signal wiring and the third signal wiring are electrically coupled to a ground potential of a second power supply or to a constant potential of the second power supply, which is a power supply of a circuit that supplies signals of the second signal wiring, the shield pattern includes a first end portion and a second end portion in the first axis direction, and the first signal wiring and the third signal wiring are disposed between the first end portion and the second end portion of the shield pattern in a plan view.

According to this configuration, a shield pattern is disposed between the coupling pattern and the signal wiring, the shield pattern, first high resistance pattern, and the second high resistance pattern have the same potential, the electric field is less likely to be generated between the first signal wiring and the third signal wiring having different electric potentials and the first high resistance pattern and the second high resistance pattern by disposing the first signal wiring and the third signal wiring having different potentials between the first end portion and the second end portion of the shield pattern, and thus, it is possible to reduce the variations in resistance value of the first high resistance pattern and the second high resistance pattern.

In the semiconductor device described above, a shield pattern may be disposed at a layer above the coupling pattern and below the signal wiring, the shield pattern may be electrically coupled to a ground potential of a first power supply or to a constant potential of the first power supply, which is a power supply of a circuit including the first high resistance pattern and the second high resistance pattern, the signal wiring may include a first signal wiring, a second signal wiring, and a third signal wiring, which are sequentially disposed along the first axis, and the first signal wiring and the third signal wiring may be electrically coupled to the ground potential of the first power supply or to the constant potential of the first power supply.

According to this configuration, the shield pattern is disposed between the coupling pattern and the signal wiring, and the shield pattern, the first signal wiring, and the third signal wiring having the same potentials make the electric field generated between the second signal wiring, and the first high resistance pattern and the second high resistance pattern having different electric potentials be less likely to be generated by making the shield pattern, the first high resistance pattern, the second high resistance pattern, the first signal wiring, and the third signal wiring have the same potentials, and thus, it is possible to reduce the variations in resistance values of the first high resistance pattern and the second high resistance pattern.

In the semiconductor device described above, a shield pattern may be disposed at a layer above the coupling pattern and below the signal wiring, the shield pattern may be electrically coupled to a ground potential of a first power supply or to a constant potential of the first power supply, which is a power supply of a circuit including the first high resistance pattern and the second high resistance pattern, the signal wiring may include a first signal wiring, a second signal wiring, a third signal wiring, a fourth signal wiring, and a fifth signal wiring sequentially disposed along the first axis, the first signal wiring and the fifth signal wiring may be electrically coupled to the ground potential of the first power supply or to the constant potential of the first power supply, and the second signal wiring and the fourth signal wiring may be electrically coupled to a ground potential of a second power supply or to a constant potential of the second power supply, which is a power supply of a circuit that supplies the signals of the third signal wiring.

According to this configuration, the shield pattern, the first signal wiring, and the fifth signal wiring having the same potentials make the electric field generated between the second signal wiring and the fourth signal wiring having different potentials and the first high resistance pattern and the second high resistance pattern be less likely to be generated by making the shield pattern, the first high resistance pattern, the second high resistance pattern, the first signal wiring, and the fifth signal wiring have the same potentials, and thus, it is possible to reduce the variations in resistance values of the first high resistance pattern and the second high resistance pattern.

The semiconductor device described above may further include a third high resistance pattern, a second coupling pattern that couples the second high resistance pattern and the third high resistance pattern, a second signal wiring disposed at a layer above the second high resistance pattern, the third high resistance pattern, and the second coupling pattern. The second coupling pattern may include a third portion that overlaps an end portion of the second high resistance pattern in a plan view at a layer above the second high resistance pattern, the second coupling pattern may include a fourth portion that overlaps the end portion of the third high resistance pattern in a plan view at the layer above the third high resistance pattern, and the second signal wiring may be disposed along the second axis between an end of the second coupling pattern at the third portion side and an end of the second coupling pattern on the fourth portion side in a plan view.

According to this configuration, since the second signal wiring can also be disposed at the layer above the second coupling pattern that couples the second high resistance pattern and the third high resistance pattern, it is possible to provide the semiconductor devices in which more signal wirings are disposed.

An oscillator includes the semiconductor device described above and a vibrator driven by the semiconductor device.

According to this configuration, since a small semiconductor device of which the signal wiring is shortened is included, it is possible to provide an oscillator having a small size.

What is claimed is:

1. A semiconductor device comprising:
a first high resistance pattern and a second high resistance pattern that are disposed along a first axis and are separated from each other;
a coupling pattern that electrically couples the first high resistance pattern and the second high resistance pattern; and
a signal wiring disposed at a layer above the first high resistance pattern, the second high resistance pattern, and the coupling pattern, wherein
the coupling pattern includes a first portion that overlaps an end portion of the first high resistance pattern in a plan view at the layer above the first high resistance pattern,
the coupling pattern includes a second portion that overlaps an end portion of the second high resistance pattern in a plan view at the upper layer from the second high resistance pattern,
the signal wiring is disposed along a second axis that intersects the first axis in a plan view between an end of the coupling pattern at the first portion side and an end of the coupling pattern at the second portion side,
a shield pattern is disposed at a layer above the coupling pattern and below the signal wiring, and
the shield pattern is electrically coupled to a ground potential or a constant potential.

2. The semiconductor device according to claim 1, wherein
the ground potential is of a first power supply and the constant potential is of the first power supply, which is a power supply of a circuit including the first high resistance pattern and the second high resistance pattern.

3. The semiconductor device according to claim 1, wherein
the ground potential is of a first power supply and the constant potential is of the first power supply, which is a power supply of a circuit including the first high resistance pattern and the second high resistance pattern,
the signal wiring includes a first signal wiring, a second signal wiring, and a third signal wiring, which are sequentially disposed along the first axis,
the first signal wiring and the third signal wiring are electrically coupled to a ground potential of a second power supply or to a constant potential of the second power supply, which is a power supply of a circuit that supplies signals of the second signal wiring,
the shield pattern includes a first end portion and a second end portion in a first axis direction, and
the first signal wiring and the third signal wiring are disposed between the first end portion and the second end portion of the shield pattern in a plan view.

4. The semiconductor device according to claim 1, wherein
the ground potential is of a first power supply and the constant potential is of the first power supply, which is a power supply of a circuit including the first high resistance pattern and the second high resistance pattern,
the signal wiring includes a first signal wiring, a second signal wiring, and a third signal wiring, which are sequentially disposed along the first axis,
the first signal wiring and the third signal wiring are electrically coupled to the ground potential of the first power supply or to the constant potential of the first power supply.

5. The semiconductor device according to claim 1, wherein
the ground potential is of a first power supply and the constant potential is of the first power supply, which is a power supply of a circuit including the first high resistance pattern and the second high resistance pattern,
the signal wiring includes a first signal wiring, a second signal wiring, a third signal wiring, a fourth signal wiring, and a fifth signal wiring sequentially disposed along the first axis,
the first signal wiring and the fifth signal wiring are electrically coupled to the ground potential of the first power supply or to the constant potential of the first power supply, and
the second signal wiring and the fourth signal wiring are electrically coupled to a ground potential of a second power supply or to a constant potential of the second power supply, which is a power supply of a circuit that supplies signals of the third signal wiring.

6. A semiconductor device comprising:
a first high resistance pattern and a second high resistance pattern that are disposed along a first axis and are separated from each other;
a coupling pattern that electrically couples the first high resistance pattern and the second high resistance pattern,
a signal wiring disposed at a layer above the first high resistance pattern, the second high resistance pattern, and the coupling pattern,
a third high resistance pattern;
a second coupling pattern that couples the second high resistance pattern and the third high resistance pattern; and
a second signal wiring disposed at a layer above the second high resistance pattern, the third high resistance pattern, and the second coupling pattern, wherein
the coupling pattern includes a first portion that overlaps an end portion of the first high resistance pattern in a plan view at the layer above the first high resistance pattern,
the coupling pattern includes a second portion that overlaps an end portion of the second high resistance pattern in a plan view at the upper layer from the second high resistance pattern,
the signal wiring disposed along a second axis that intersects the first axis in a plan view between an end of the coupling pattern at the first portion side and an end of the coupling pattern at the second portion side,
the second coupling pattern includes a third portion that overlaps the end portion of the second high resistance pattern in a plan view at the layer above the second high resistance pattern, the second coupling pattern includes a fourth portion that overlaps an end portion of the third high resistance pattern in a plan view at a layer above the third high resistance pattern, and the second signal wiring is disposed along the second axis between an end of the second coupling pattern at the third portion side and an end of the second coupling pattern at the fourth portion side in a plan view.

7. An oscillator comprising:

the semiconductor device according to claim 1; and a vibrator driven by the semiconductor device.

* * * * *